(12) United States Patent
Ono

(10) Patent No.: US 6,531,660 B2
(45) Date of Patent: Mar. 11, 2003

(54) PRINTED SUBSTRATE BOARD

(75) Inventor: Atsushi Ono, Tokyo (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 259 days.

(21) Appl. No.: 09/754,659

(22) Filed: Jan. 4, 2001

(65) Prior Publication Data

US 2001/0010850 A1 Aug. 2, 2001

(30) Foreign Application Priority Data

Jan. 28, 2000 (JP) ........................................ 2000-019880

(51) Int. Cl.[7] ................................................ H05K 1/02
(52) U.S. Cl. ........................ 174/254; 174/250; 29/829; 29/830; 227/76; 361/749
(58) Field of Search ................................. 174/254, 250; 361/749, 796; 29/829, 830, 831, 564.1, 852; 227/76

(56) References Cited

U.S. PATENT DOCUMENTS

| | | | | |
|---|---|---|---|---|
| 3,863,261 A | * | 1/1975 | Klein | 361/749 |
| 5,044,053 A | * | 9/1991 | Kopel et al. | 29/25.35 |
| 5,745,426 A | * | 4/1998 | Sekiyama | 365/226 |
| 5,915,031 A | * | 6/1999 | Hanright | 381/323 |

* cited by examiner

Primary Examiner—Albert W. Paladini
(74) Attorney, Agent, or Firm—Darby & Darby

(57) ABSTRACT

A printed substrate board constructed, from a substantially unitary body includes at least one edge part along a side mountable into an external mounting device. The printed board includes individual board bodies having a shape that is out of parallel with the edge part. The individual board bodies have at least one portion of an opposing side joined to the edge parts through a secondary part. The secondary parts, combined with the individual board bodies, are substantially parallel with the edge parts and allow simple separation of each board body from the printed board along cutting boundary portions while enabling simplified orientation for later assembly.

8 Claims, 2 Drawing Sheets

PRINTED SUBSTRATE BOARD

BACKGROUND TO THE INVENTION

1. Field of the Invention

The present invention relates to a printed substrate board equipped with edge portions on at least one side. The printed substrate board is a type designed to include multiple board bodies for receiving external electronic parts during later assembly [printed substrate board hereinafter referred to as a printed board].

2. Description of the Related Art

As shown in FIG. 2, a conventional printed board 1 is constructed from a plurality of printed board bodies 2 (four shown), each aligned vertically relative to board 1. A pair of discardable edge parts 3 extend along both sides of printed board 1. Edge parts 3 act as lead portions to maintain alignment for an external mounter, as will be explained.

During initial creation, printed board bodies 2 and edge parts 3 are formed from single board 1 by cutting or punching in a conventional manner along manufacturer specified locations.

During initial creation, cutting parts 4 are formed along the boundaries between board bodies 2 and edge portions 3, to assist in later separation. Cutting parts 4 include multiple holes and slots to aid in later separation, as will be explained.

Edge parts 3 serve to retain printed board bodies 2 in printed board 1. After initial formation, board 1 is loaded onto the external mounter guided by edge parts 3 generally for automatic insertion of parts. Various parts specified by the manufacturer are mounted onto each board body 2. Frequently, printed board bodies 2 have chip parts, connecting wires, or other electronic equipment mounted during assembly.

After mounting, each printed board body 2 is separated along cutting parts 4 from board 1 and edge parts 3, separating each printed board body 2 into an individual unit.

In conventional printed board 1, each printed board body 2 is directly supported on both sides by edge parts 3. The shape of printed board bodies 2 is conventionally limited to a substantially rectangular shape.

However, for electronic controllers used in game machines or in other unusually shaped devices, a substantially non-rectangular shape printed board body is desirable and is frequently necessary to achieve miniaturization, waste minimization, and other manufacturing goals.

Additionally, efficient placement or orientation for the above-described electronic parts upon printed board bodies 2 is frequently limited by the conventional rectangular shape. As a result, a more beneficial orientation for board bodies 2, relative to edge parts 3, is desirable and would allow easier and more efficient placement of electronic parts during mounting and later assembly.

OBJECT AND SUMMARY OF THE INVENTION

It is an object of the present invention to provide a board, including at least one edge part usable as a conventional mounter lead, with at least one randomly shaped non-rectangular board body.

It is another object of the present invention is to provide a printed board, with randomly shaped board bodies that allows for easy orienting for efficient placement of electronic parts during mounting and later assembly.

It is another object of the present invention to provide a printed board, with edge parts usable as conventional mounter leads that support multiple types of randomly shaped board bodies.

It is another object of the present invention to provide a printed board, capable of adequately supporting at least one randomly shaped board body with at least one secondary part while allowing edge parts usable as similar conventional mounter leads.

It is another object of the present invention to provide printed board bodies with complex shapes corresponding to complex shape requirements where the board bodies allow a sufficiently large space to receive all required parts within an electronic device.

Briefly stated, the present invention provides a printed board constructed from a substantially unitary body provided with edge parts along opposing sides for mounting into a mounting device. The printed board includes randomly shaped board bodies each having at least one portion of each opposing side joined to the edge parts through secondary parts. The secondary parts supporting each board body and allowing simple separation of each board body from the printed board and the edge parts along cutting boundary portions.

According to an embodiment of the present invention, there is provided a printed substrate board, comprising: at least a first board body in the printed substrate board, the first board body having a first shaped edge, at least one edge portion in the printed substrate board, the edge portion having at least a first and second edge, the first and second edges substantially parallel to each other, the first shaped edge substantially nonparallel to the second edge, a first cutting portion between the first shaped edge and the second edge, the first cutting portion adjoining the second edge, a second cutting portion between the first shaped edge and the first cutting portion, the second cutting portion adjoining the first shaped edge, at least one secondary part between and adjoining both the first and second edge portions, the first and second cutting portions enabling simple separation between the first board body, the edge portion, and the second cutting portion, and the secondary part having a shape complementary to both the first shaped edge and the second edge whereby the first board body engages the edge portion through the secondary part in a substantially parallel manner.

According to another embodiment of the invention, there is provided a printed board wherein: the board bodies are aligned in a single direction between the at least first and second edge parts.

According to another embodiment of the invention, there is provided a printed board further comprising: at least a first and a second randomly shaped board body, and the at least first and second board bodies connecting to each other by at least one cutting boundary portion.

According to another embodiment of the invention, there is provided a printed board wherein: the at least first and second board bodies connect each edge part through the at least one secondary part.

According to another embodiment of the invention, there is provided a printed board, further comprising: at least one tertiary part connecting the at least a first and a second board bodies by at least one cutting boundary portion, and the at least first and second board bodies connecting to the edge parts through the secondary part.

According to another embodiment of the invention, there is provided a printed board, further comprising: the substantially unitary body including at least a third and a fourth edge part on opposing sides of the unitary body and being of a type mountable into the external device, and the at least one board body connecting to the third and fourth edge part through the at least one secondary part.

According to another embodiment of the invention there is provided a method of forming a randomly shaped printed board body, comprising the steps of: determining at least one desired random shape for a printed body element in response to a customer need, positioning the at least one random shape on a preformed printed board body in response to an external mounting operation, determining a secondary shape for at least one discarding element in response to the at least one random shape and the external mounting operation, positioning the at least one secondary shape on the preformed printed board body in response to the external mounting operation and the random shape, and forming a plurality of cutting parts on the pre-formed printed board body whereby the printed body element and the at least one discarding element are substantially separate from the pre-formed printed board.

According to another embodiment of the invention, there is provided a printed board being of a type constructed from a single board, comprising: a plurality of randomly shaped printed board bodies, each printed board body aligning in a single direction and being of a type mountable with external parts, at least one edge part extending along at least one side of the printed board bodies, the at least one edge part being of a type mountable into an external device, at least one discarding board part connecting at least one side of the printed board bodies to the at least one edge part, and at least one boundary portion separating each printed board body from the discarding board part and the at least one edge part.

The above, and other objects, features, and advantages of the present invention will become apparent from the following description read in conjunction with the accompanying drawings, in which like reference numerals designate the same elements.

DESCRIPTION OF THE PREFERRED EMBODIMENT

Figure 1:
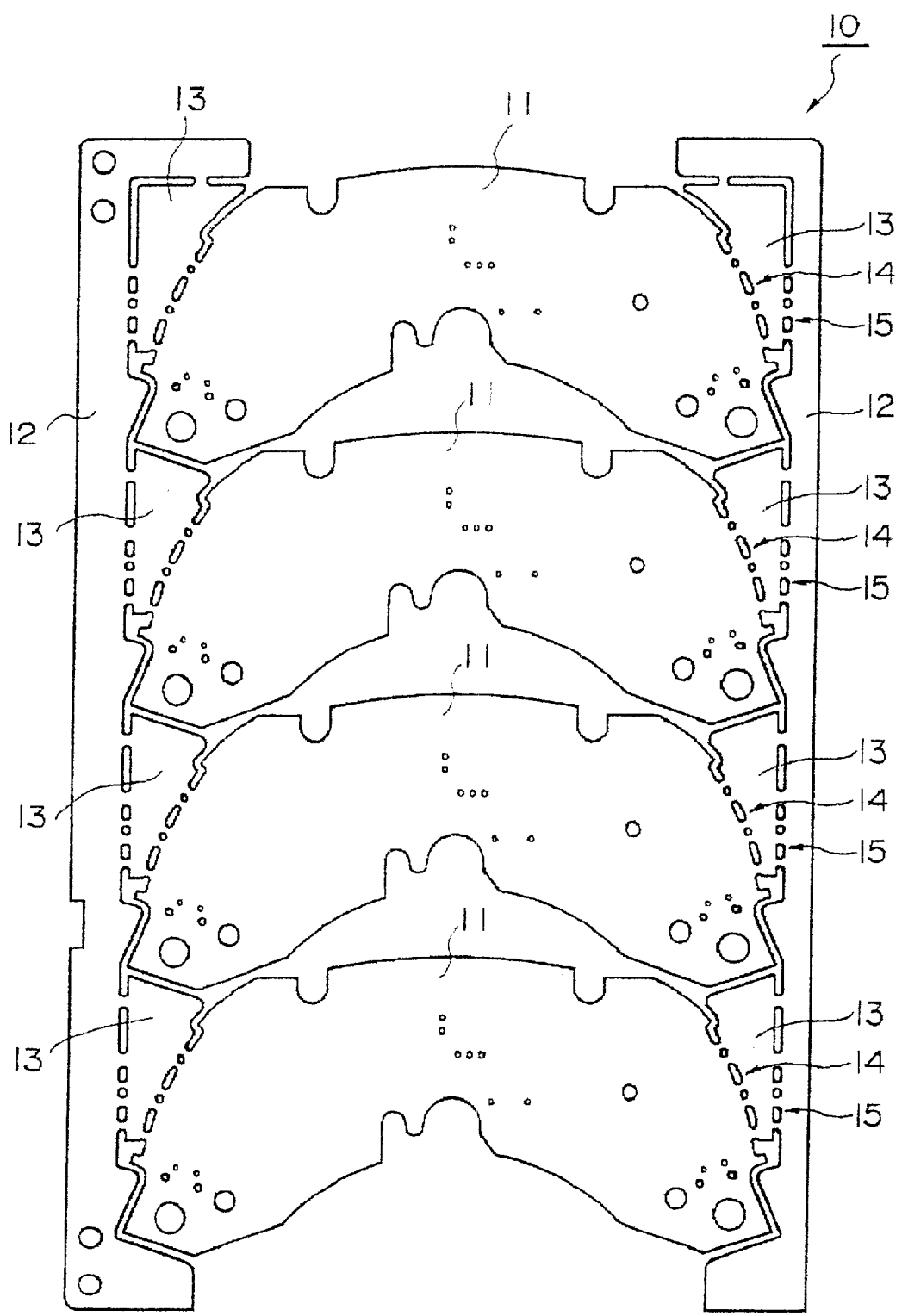
FIG. 1 is a plan view showing an embodiment of a printed board according to the present invention.
Figure 2:
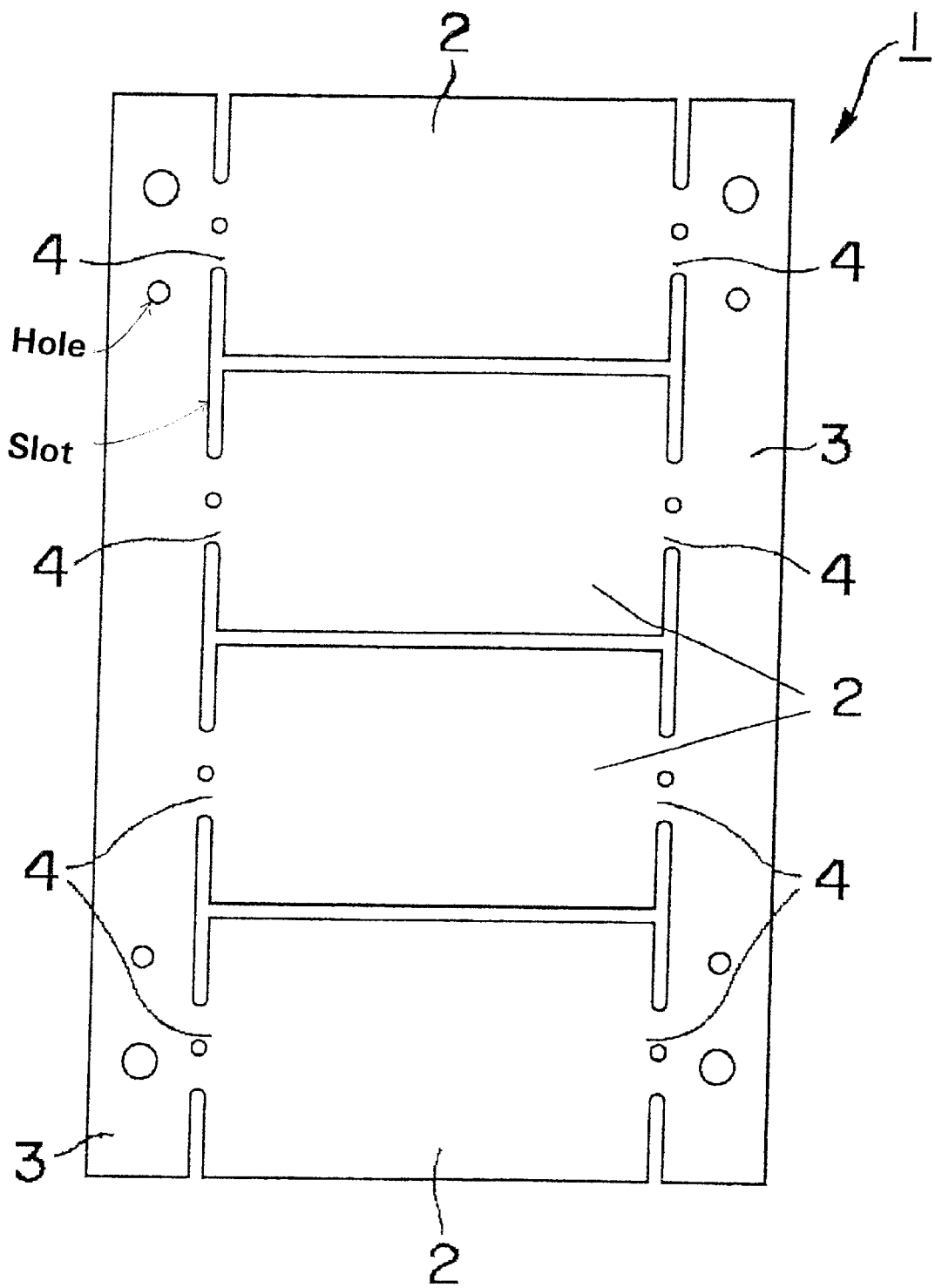
FIG. 2 is a plan view showing an example of a conventional printed board.

Referring now to FIG. 1, a printed board 10 is constructed from a plurality of randomly-shaped printed board bodies 11. Printed board bodies 11 are aligned vertically relative to the page and are randomly-shaped to act as controllers in electronic game machines or in other electronic device. Other shapes for board bodies 11 may be chosen in response to manufacturer need or customer demand.

A pair of edge parts 12 extend vertically, relative to the page, along opposite sides of board bodies 11. Secondary board parts 13, serving as a discardable board parts, are provided between each printed board body 11 and edge part 12 to securely connect board body 11 to edge part 12.

Edge parts 12 retain each printed board body 11 and are used to load printed board 10 onto an external mounter. The external mounter mounts multiple parts and items onto each printed board body 12 in a position determined by manufacturing or customer design.

Secondary board parts 13 are formed to substantially fill the space between board body 11 and edge parts 12. Secondary board parts 13 join each printed board body 11 and edge part 12 and help to maintain the necessary rigidity and work-ability of printed board 10 during processing.

A cutting parts 14 joins secondary parts 13 to board bodies 11 to create a boundary portion between each respective part. A cutting part 15 joins edge parts 12 to secondary board parts 13 to create a boundary portion between each respective part. Cutting parts 14 and 15 include multiple holes, spaces, or slots, and are formed in a cutting or punching process after the initial formation of printed board 10. Cutting parts 14 and 15, act together with secondary board parts 13 and board bodies 11 to maintain printed board 10 as a unitary body during initial formation and the later mounting process.

It is desirable to have edge parts 12 usable with existing mounting devices during the mounting operation. Through a combination of edge parts 12, secondary parts 13, cutting parts 14 and 15, and randomly shaped board bodies 11, a manufacture may accommodate this desire while creating a printed board 10 responsive to customer demands and manufacturer needs.

Also during the mounting operation, it is frequently desirable to arrange mounted components as tightly as possible on printed board bodies 11 and to thus minimize the size of board bodies 11 relative to a miniature device (not shown). To accommodate this desire, a manufacture may use the present invention to both reorient previously shaped board bodies 11, relative to edge parts 12, and to reshape board bodies 11, as described above. In this manner, a manufacturer may maximize the use of a limited mounting process in response to a customer demand and a shape restriction.

It will be appreciated that printed board 10 must be constructed to maintain a manufacturer-desired minimum level of rigidity sufficient to successfully complete a mounting process as determined by the manufacturer.

After mounting, a manufacturer-controlled separation process begins by first cutting part 15 along the inner border of edge parts 12 at the linear boundary portion with secondary board part 13. As a result, printed board body 11 and secondary or discarding board part 13 are separated from edge part 12. Second, by further cutting along cutting part 14, at the boundary portion between each printed board body 11 and secondary board part 13, printed board body 11 is separated from secondary part 13. As result, individual printed board bodies 1I1 are available for later processing.

It will also be appreciated that where one side of a board body 11 is parallel with edge part 12, and a second side is randomly shaped, a single secondary board part 13 may be used to support and bridge board body 11 between edge parts 12. It is to be understood that one board body 11 and at least one single secondary board part 13 can be arranged in adjacent complementary positions relative to each other so that together both may be substantially parallel with edge part 12. In other words, board body 11 and secondary board part 13 may be in complementary juxtaposition so as to have one edge substantially parallel with edge part 12.

It will also be appreciated that while printed board bodies 11 are shown with substantially the same shape, that the present invention accommodates multiple other randomly shaped board bodies 11, where each is created to fill a customer need. As a result, substantially any two dimensional randomly shaped board body 11 configuration may be provided with edge parts 12 for later mounting. Additionally, multiple randomly shaped board bodies 11 may be positioned together on the same printed board 10 and thus minimize manufacturing waste and costs. It is to be understood that board bodies 11 described as randomly shaped, are board bodies 11 that are at least partially out of parallel with edge parts 12.

It will also be appreciated that while printed board bodies 11 are shown aligned vertically with the page of FIG. 1, that other non aligned orientations may be created according to customer or manufacturer need.

It will be also appreciated that where printed board body 11 has a substantially random or at least partially nonparallel shape, a combination of adaptively formed edge parts 12, secondary bodies 13, and other tertiary or quaternary bodies (both not shown) may be used to form a substantially unitary printed board 10 with sufficient rigidity to complete a mounting process.

It will also be appreciated that while the present embodiment of printed board 10 includes printed board bodies 11 attached to edge parts 12 through secondary board parts 13, printed board bodies 1 may also be attached directly to edge parts 12 when necessary to accommodate unusual shapes.

It will also be appreciated that only one edge part 12 may be used to form printed board 10, and connecting to printed board bodies 11 through secondary parts 13, thus allowing a savings in weight and materials costs.

It will also be appreciated that more than two edge parts 12 may be used to form printed board 10, thus allowing a mounting process to be conducted with multiple orientations.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A printed substrate board, comprising:
   at least a first board body in said printed substrate board;
   said first board body having a first shaped edge;
   at least one edge portion in said printed substrate board;
   said edge portion having at least a first and second edge;
   said first and second edges substantially parallel to each other;
   said first shaped edge substantially nonparallel to said second edge;
   a first cutting portion between said first shaped edge and said second edge;
   said first cutting portion adjoining said second edge;
   a second cutting portion between said first shaped edge and said first cutting portion;
   said second cutting portion adjoining said first shaped edge;
   at least one secondary part between and adjoining both said first and second edge portions;
   said first and second cutting portions enabling simple separation between said first board body, said edge portion, and said second cutting portion; and
   said secondary part having a shape complementary to both said first shaped edge and said second edge whereby said first board body engages said edge portion through said secondary part in a substantially parallel manner.

2. A printed substrate board according to claim 1, wherein:
   said first board body and said secondary part are substantially aligned in a first direction along said edge portion.

3. A printed substrate board as in claim 2, further comprising:
   at least a first and a second board body in said printed substrate board;
   at least a third cutting portion adjoining said first and second board bodies;
   said first and second board bodies opposite said edge portion;
   said secondary part between said first board body and said edge portion;
   said secondary part having a shape complementary to both said first and second board bodies whereby said first board body engages said edge portion through said secondary part in a substantially parallel manner.

4. A printed substrate board as in claim 3, further comprising:
   at least a first and a second edge portion in said printed substrate board;
   said first and second edge portions each having a first and second edge;
   said first and second edges being substantially parallel;
   said first and second board bodies between said second edges;
   said first and second board bodies each having a first shaped edge;
   said first shaped edges substantially nonparallel to said second edges;
   said first cutting portions between said first shaped edges and said second edges;
   said first cutting portions adjoining said second edges;
   said second cutting portions between said first shaped edges and said first cutting portions;
   said second cutting portions adjoining said first shaped edges;
   at least two secondary parts each adjoining said first and second cutting portions; and
   said secondary parts having a shape complementary to each said first shaped edge and said second edges whereby said first and second board bodies engage said first and second edge portions through said secondary parts in a substantially parallel manner.

5. A printed substrate board as in claim 4, further comprising:
   at least one tertiary part;
   said tertiary part between said first and a second board bodies and said fist and second edge portions;
   at least a fourth cutting boundary portion adjoining said tertiary part and said first and second board bodies; and
   said tertiary part having a shape complementary to said first and second board bodies and said secondary parts, whereby said tertiary part and said first and secondary board bodies engage each said first and second edge portions through said secondary parts in a substantially parallel manner.

6. A printed substrate board as in claim 5, further comprising:
   at least a third and a fourth edge portions on opposing sides of said printed substrate board;
   said third and fourth edge portions mountable into an external device;
   said third and fourth edge portions substantially parallel to each other;
   said third and fourth edge portions adjacent to at least said first board body and at least one said secondary part; and said third and fourth edge portions having a shape complementary to said at least first board body and said at least one secondary part whereby said at least first board body engages said third and fourth edge portions through said secondary parts in a substantially parallel manner.

7. A method of forming a shaped printed substrate board element, comprising the steps of:

determining a first desired shape for a first board body at least partially out of parallel with a first and second edge portion;

determining a second desired shape for at least one secondary element, complementary to said first desired shape, whereby a combination of said first desired shape and said second desired shape is engagable to first and second edge portions in a substantially parallel manner; and forming a plurality of cutting portions on said printed substrate board at least partially separating said first desired shape from said second desired shape and from said first and second portions, whereby said first board body and said secondary element are at least partially separated from said first and second edge portions and from said printed substrate board.

8. A printed substrate board, being of a type constructed from a single board, comprising:

a plurality of shaped printed board bodies;

said printed board bodies aligning in a single direction and being of a type mountable with external parts;

at least one edge part extending along at least one side of said printed board bodies;

said at least one edge part being of a type mountable into an external device;

at least one discarding board part connecting at least one side of said printed board bodies to said at least one edge part; and at least one cutting portion separating each said printed board body from said discarding board part and said at least one edge part.

* * * * *